United States Patent
Dials et al.

[11] Patent Number: 6,000,768
[45] Date of Patent: Dec. 14, 1999

[54] MINIMAL FASTENER ELECTRONIC CONSOLE

[75] Inventors: Edward Nela Dials, Apex; Aubrey Lamond Hodges, Creedmoor; Steven Richard Luglan, Raleigh, all of N.C.

[73] Assignee: International Business Machines Corporation, Armonk, N.Y.

[21] Appl. No.: 09/049,235

[22] Filed: Mar. 27, 1998

[51] Int. Cl.[6] .................................................. A47B 81/06
[52] U.S. Cl. .................................. 312/223.2; 312/319.2; 361/727
[58] Field of Search ............................ 312/223.2, 223.1, 312/319.2; 16/266; 361/725, 726, 727

[56] References Cited

U.S. PATENT DOCUMENTS

| | | | |
|---|---|---|---|
| 5,240,319 | 8/1993 | Koga | 312/391.2 |
| 5,392,192 | 2/1995 | Dunn et al. | |
| 5,593,219 | 1/1997 | Ho | |
| 5,600,538 | 2/1997 | Xanthopoulos | |
| 5,764,480 | 6/1998 | Crump et al. | 312/223.2 |

FOREIGN PATENT DOCUMENTS 212607  12/1960  Austria ................................ 312/319.2

*Primary Examiner*—Peter M. Cuomo
*Assistant Examiner*—Gerald Anderson
*Attorney, Agent, or Firm*—Anthony N. Magistrale

[57] ABSTRACT

An electronic device console is disclosed for small computers and similar electronic devices of the type that has a base and an upper assembly that raises when a unique latch is released to place computer devices such as printing, data storage and other devices mounted in the assembly into operating position. The upper assembly may be completely removed from the console without the use of tools, merely by rotating the assembly and unplugging electronic connectors. Inadvertent rotation and separation of the assembly from the console is prevented by interference between side covers and the pinion gear of a viscous motion damping element of the assembly until the side covers are removed.

5 Claims, 7 Drawing Sheets

MINIMAL FASTENER ELECTRONIC CONSOLE

BACKGROUND OF THE INVENTION

1. Field of the Invention

This invention relates to small computers and similar electronic devices of the type that has a base assembly and an upper assembly that can be raised to provide access to computer devices such as printing, data storage and other devices mounted in the upper assembly.

2. Description of the Prior Art

The use of snap together parts for electronic devices such as computer consoles is known in the art in U.S. Pat. No. 5,392,192 issued to Dunn et al. The Dunn patent teaches a five sided box shaped steel chassis and an internal subassembly tray. The tray has bays to receive components such as disk drives. The teaching still suffers from the problem that tools must be used to remove components and subassemblies from the console.

U.S. Pat. No. 5,593,219 shows a computer housing in the shape of a rectangular base frame having rows of lugs, rows of hooks and a row of sliding slots. Cover panels having reinforcing ribs with retaining holes are fastened to the chassis by engagement between the hooks and retaining holes. Cover panels also having crossed tenons are fastened by engaging their tenons with the sliding slots. The mounting of a component within the housing is not shown in this reference.

U.S. Pat. No. 5,600,538 by Xanthopoulos is also directed to a personal computer housing. This patent shows a formed metal base chassis to which a top formed metal cover is attached by means of lugs on the cover which engage ears on the base side walls. A sub-chassis in the housing is removable through the top when a screw is removed and the cover is removed. The main circuit board is mounted on tracks between a wall of the housing and the sub-chassis. The circuit board can be slid on the tracks and removed out the back of the housing. Tools must still be used to remove components and subassemblies from the housing.

SUMMARY OF THE INVENTION

These problems of component mounting and disassembly are solved by the invention which provides an integrated package of mounting apparatus that includes 90 degree keyed pivots for component subassembly removal; a spring/rod/bushing assembly engageable with the subassembly, the spring assembly acting against special stops in the console base; and a separate client-card compartment for easy access to cables yet keeping them secure and sightly. The invention provides a stable mechanism with parts that remain in place during disassembly and automatically re-engage during re-assembly. These parts include the keyed pivots, the lift spring assembly, motion damping assemblies and covers that improve appearance while also limiting subassembly travel into operating position.

Accordingly it is an advantage of the invention that electronic components may be removed from or placed into the electronic device console with a minimum of tools and with simple disassembly, assembly steps.

It is a further advantage that a subassembly of the console, including electronic components may be simply removed from the electronic device console before the electronic components are removed from the subassembly.

It is a still further advantage of the invention that the subassembly may be released and rotated on keyed pivots for lifting the subassembly out of the electronic device console without the use of tools.

It is another advantage of the invention that a separate client card compartment is provided for easy access to cables connecting an electronic component to the console and providing the ability to unplug the component without resort to tools.

Another advantage of the invention is that the subassembly is latched into a closed position and unlatched into an open and operating position by the travel of a simple spring wire in a bi-stable path, allowing pressure and small travel of the subassembly to alternately latch and unlatch the subassembly into the closed position and into the open operating position.

It is also an advantage that the subassembly may be moved from the open operating position by simple rotation into a substantially vertical position where the keyed pivots release from the base of the electronic device console.

It is still another advantage of the invention that geared damping elements are automatically re-engaged and the latch spring automatically re-enters it's bi-stable path while the subassembly is rotated on it's keyed pivots from the vertical position to the operating position.

It is yet a further advantage of the invention that the covers that improve appearance also limit subassembly travel into operating position, and yet may be easily removed without tools by first removing a latching cover held in place by a detent, the latching cover having pins that fix the travel limiting covers into place so that they can not be removed until the latching cover has been removed.

DESCRIPTION OF A PREFERRED EMBODIMENT

Figure 1:
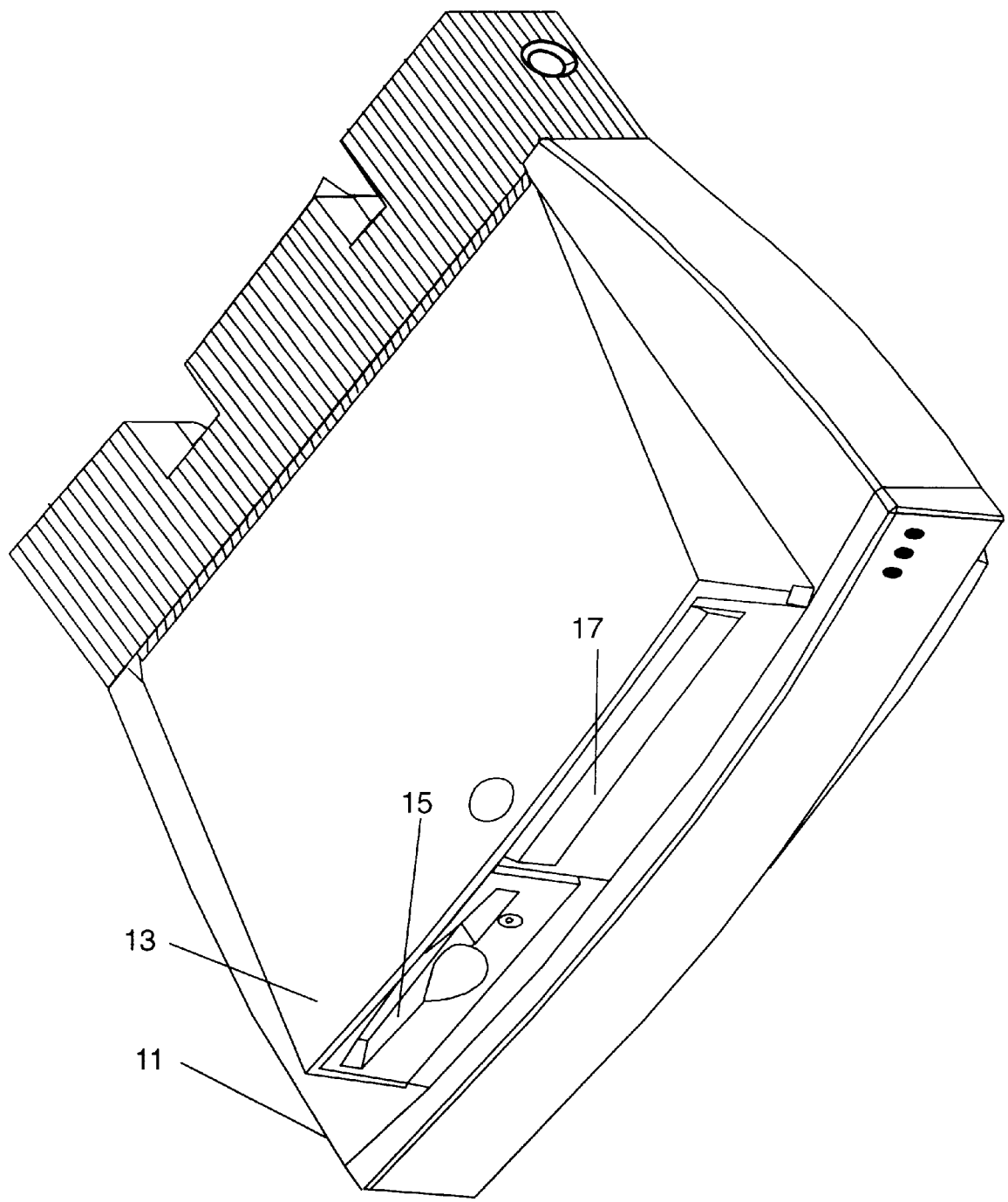
FIG. 1 shows a perspective view of the electronic device with a component subassembly raised into operating position.

A preferred embodiment of the invention will now be described with reference to the Figures. FIG. 1 shows an example electronic device 11 in the form of a computer media console. The upper assembly 13 of computer media console 11 is shown in its raised position where access to the diskette and CDROM insertion slots appear at 15 and 17. The upper sub assembly 13 may be pressed down and the latch shown in FIG. 2, retains the assembly in a closed position. When the upper assembly is pressed down a second time, the latch releases and the upper assembly is raised into operating position by the lift spring. From the operating position, the upper subassembly 13 can be lifted manually into operating position by rotating the upper subassembly.

Figure 2:
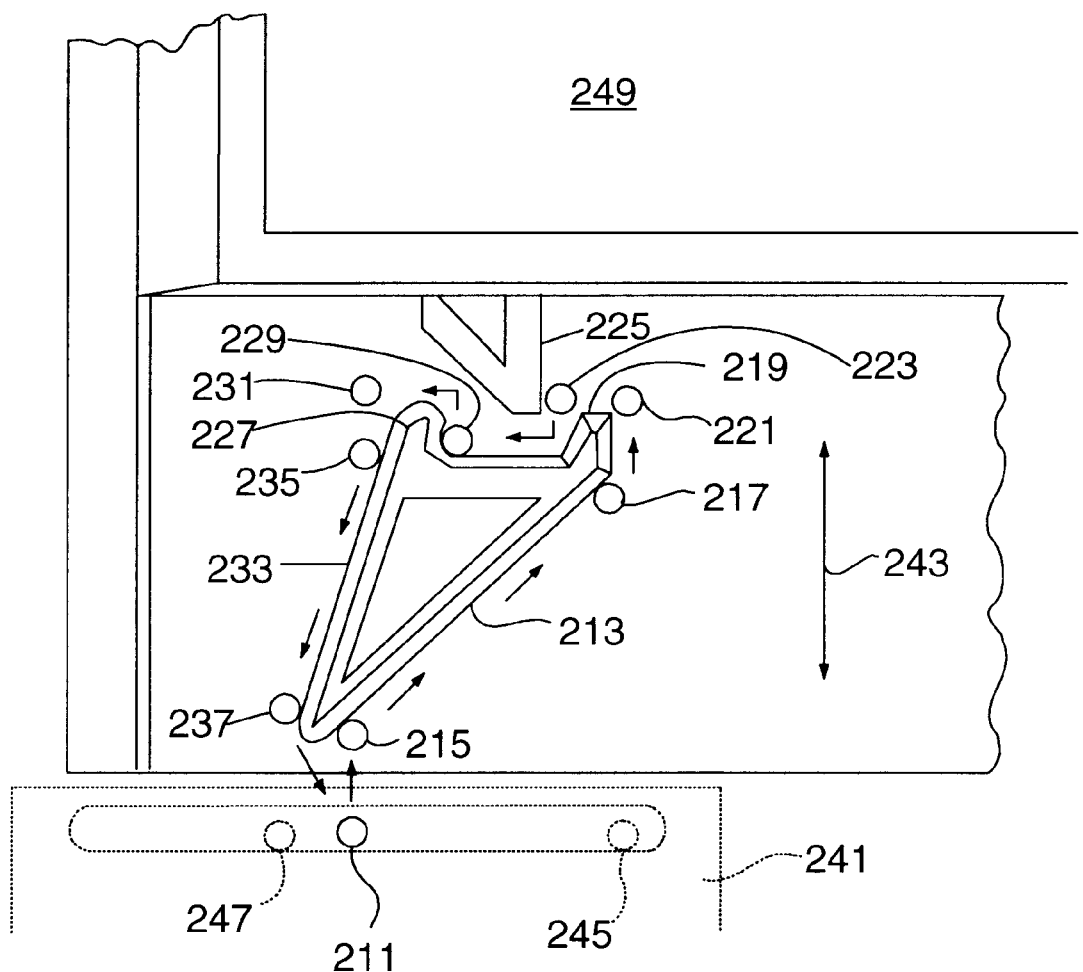
FIG. 2 is a view of the latching tip of the latch spring wire and bi-stable travel path.

FIG. 2 shows the inside front of the upper subassembly from the section A—A using the upper subassembly as the reference. The tip of the latch spring wire which is mounted into the base 19 is shown as a circle that moves through the bi-stable path since the point of reference is in the upper subassembly. In the unlatched operating position, the upper subassembly is raised so the tip of the latch spring is at position 211. When the upper subassembly is pressed down, the tip of the latch spring moves along the ramp 213 from position 215 to position 217. Further downward motion of the upper subassembly causes the tip of the latch spring wire to move around the end 219 of the latch from position 221 to position 223 where it is arrested from further travels in the counterclockwise direction by stop 225. The upper subassembly is now fully depressed and when the pressure is released, the subassembly rises slightly allowing the tip of the latch spring wire to slip off of the stop 225 and be caught at catch 227 in position 229 where it holds the upper subassembly from rising further thereby latching the upper subassembly into the closed position. When the upper subassembly is depressed a second time, the tip of the latch spring wire is released from catch 227 and travels counter clockwise from position 229 to position 231. The user may then release pressure on the upper subassembly allowing it to rise as the tip of the latch spring wire moves down ramp 233 from position 235 to position 237. At position 237, the tip of the latch spring wire slips off of the end of ramp 233 into its unlatched position at 211 with the upper subassembly in the operating position shown in FIG. 1.

Although the tip of the latch spring wire is shown in FIG. 2 as moving in a counter clockwise path around the bi-stable latch, in fact the wire itself is constrained to move only back and forth horizontally in the base by the guide 241 shown in broken lines. The apparent vertical motion of the tip of the latch spring wire is actually created by the vertical motion 243 of the molded part including latch ramps 213, 233, stop 225, end 219 and catch 227 which are molded into the inside front of the upper subassembly. The apparent counter clockwise motion derives from choosing the point of reference to be the inside front of the upper subassembly rather than the inside of the base. By choosing the reference in this way, the relative motions of the ramps and the tip of the latch spring wire can be more clearly shown with out the overlap or multiple figures that would be required if the point of reference were chosen to be in the base of the console. Necessary horizontal motion of the tip of the latch spring wire is not constrained by guide 241 but is allowed to move as far right as position 245 corresponding to position 221 and as far left as position 247 corresponding to position 237.

Figure 3:
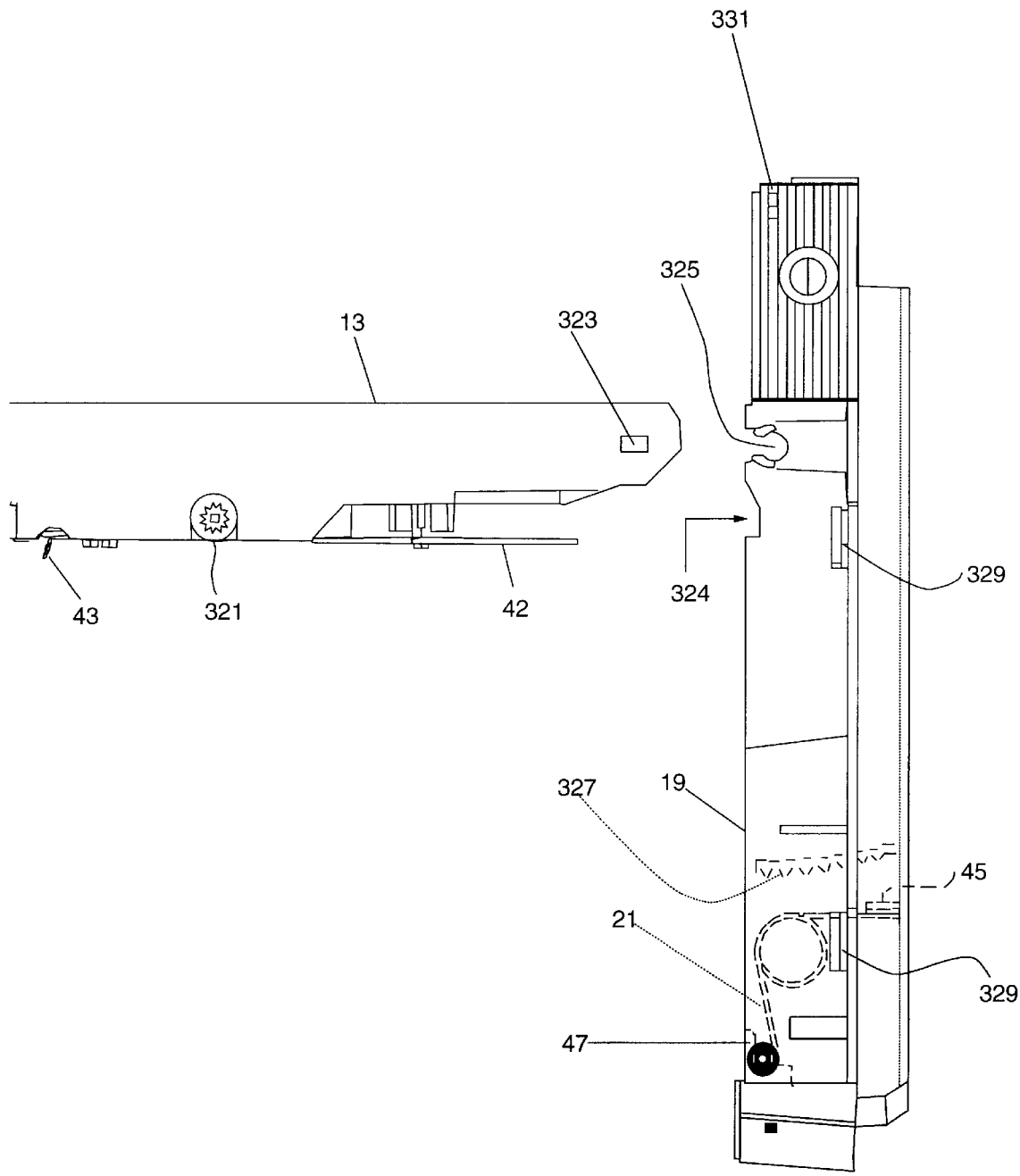
FIG. 3 is a side view of the keyed pivot of the component subassembly being assembled or disassembled with respect to the base.

Referring now to FIG. 3, the base 19, and the upper assembly 13, are shown being connected by motion of the upper assembly in the direction of arrow 324 into a pivoting relationship and the lift spring 21 is shown through the side of the base 19 in broken lines as it has been installed in the base 19. Upper assembly 13 has a DASD support bracket 42 which holds the media drives in place. The bracket 42 has a lip 43 which provides a seat to engage rod 33 between the two bushings 39 and 41. Upper assembly 13 has a relief at each side of the upper assembly which will clear rod 33 and the two bushings 39 and 41 when the upper assembly is rotated down into operating position in the base 19. The base 19 has a pair of supports 45 molded into the bottom of base 19 to support the ends of central base portion 23 of spring 21. The base 19 also has a pair of stops 47 molded into the side wall of base 19 at the front wall in order to hold spring 21 in place when the upper assembly 13 is pivoted out of the base 13 for service. The stops 47 engage the ends of rod 33 outside of the two bushings 39 and 41 in the preferred embodiment. Placement of the stops on the side wall or front wall or in the corner of both walls is a matter of design choice in implementing the invention.

Also shown in FIG. 3 are the geared damping elements 321 which are automatically re-engaged while the subassembly is rotated on it's keyed pivot pins 323 from the vertical position to the operating position. The pins 323 are inserted into sockets 325 which capture the pins when the subassembly is rotated into operating position. Rack 327 is shown in broken lines since it is part of the inside side wall of the base 19. The pinon gear and its viscous damping element 321 are mounted, one at each side of the subassembly as shown. The viscous damping element can be Part Number 002P-C available from Lake Somers Inc.

In addition, FIG. 3 shows two of the side grooves 329 that hold a side cover 511 down in position to restrain the pinion gear 322 of damping element 321 from rising above the operating position unless the side covers 511 have been removed. These parts are shown in further detail with respect to FIG. 6. Another groove 331 in the rear side wall of the base 19 accepts a sliding cover over the client card compartment. The cover over the client card compartment also latches the side covers 511 in place as is shown in greater detail in FIG. 6.

Figure 4:
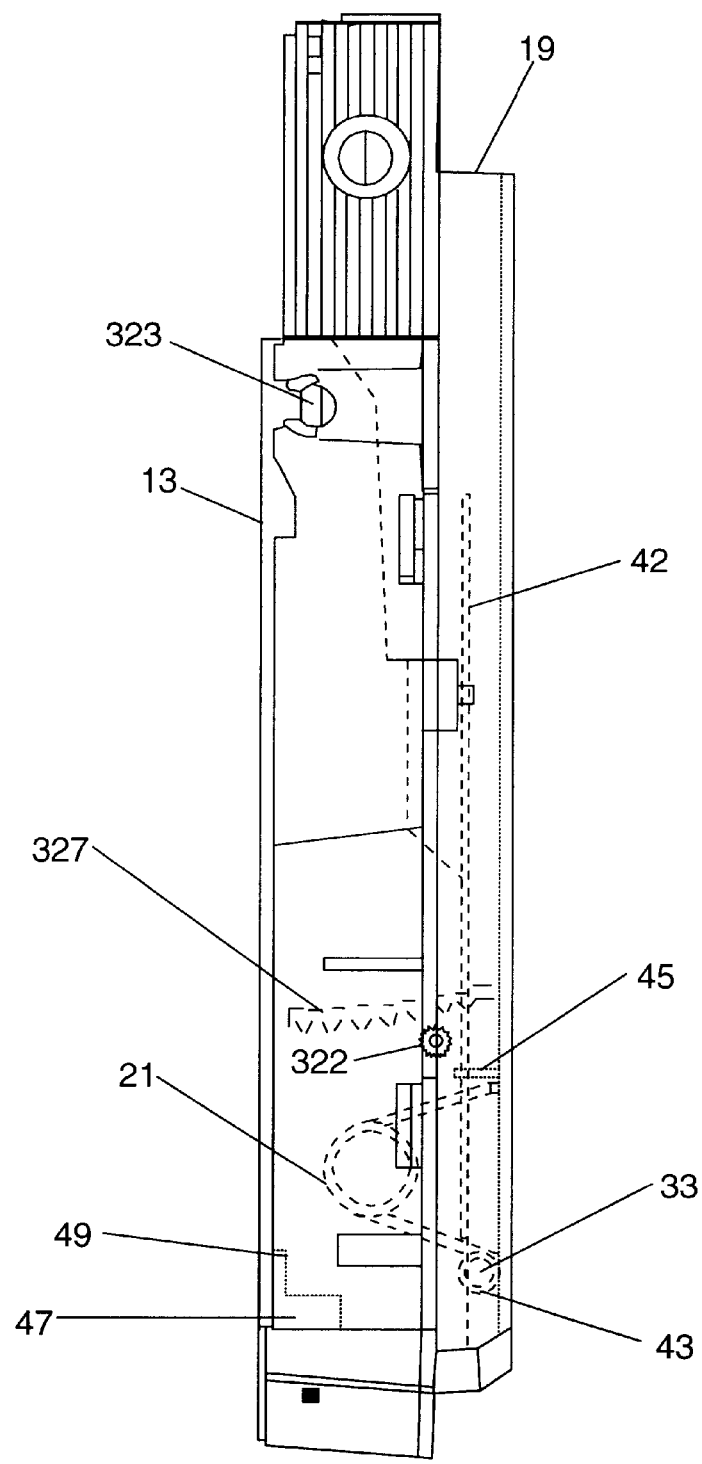
FIG. 4 is a side view of the console of the invention with the subassembly closed and latched into the base.

Attention is now directed to FIG. 4 where the same right side of the console, is depicted with the side cover off and the subassembly 13 closed down and latched into the base 19. Lift spring 21 is in its fully flexed position, ready to raise the upper assembly 13 when the latch is released. In this Figure, the stop 47 is more clearly seen to prevent over travel in both the upward and forward directions as the rod 33 is released from lip seat 43 when the upper assembly is rotated into the vertical position for removal and servicing. The bushing 39 which connects spring 21 to the rod 33 is omitted from FIG. 4 in order to show the relationship of lip 43 and rod 33 more clearly. Also shown in broken lines in FIG. 4 is the pinion gear of viscous damper 321 and rack gear 327.

Figure 5:
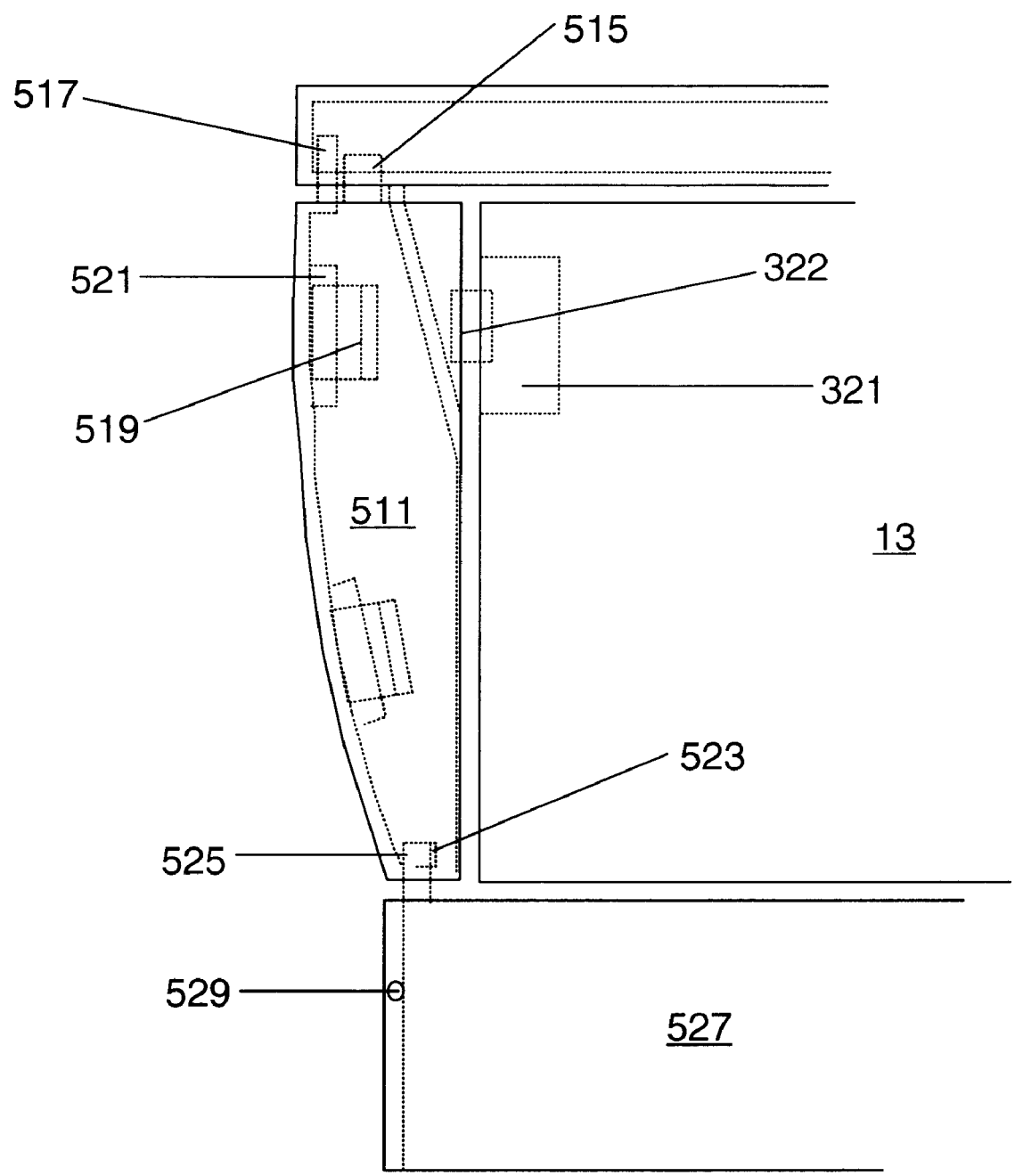
FIG. 5 is a top view of the console of the invention showing how the side cover is attached to the console and latched by the sliding cover.
Figure 6:
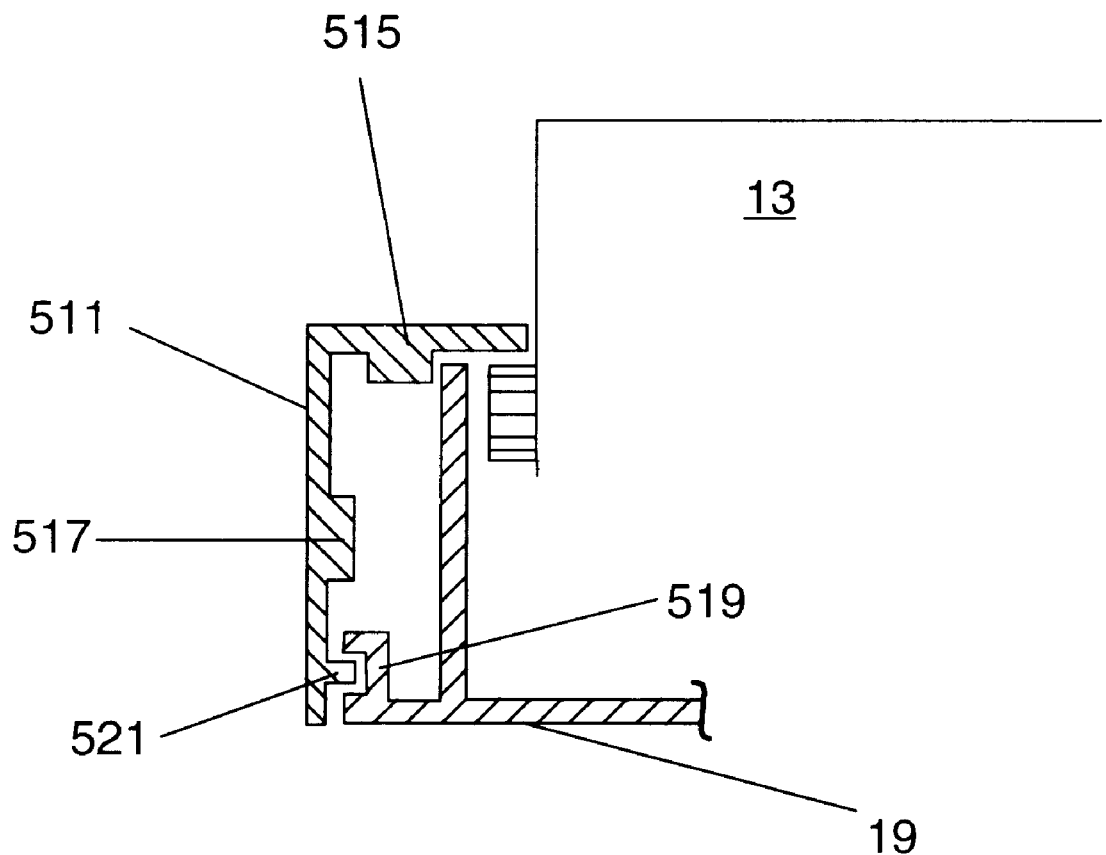
FIG. 6 is a rear section view of the console of the invention showing how the damping gear doubles as a stop against the side cover and how the side cover is interlocked to the base of the console.

In FIG. 5, a top view of the console is shown so that the attachment of the side cover can be described. Side cover 511 has a shape as shown to overlap the side wall of base 19 thereby covering the pinion gear 322 of viscous damper 321, spring 21 and the end of rod 33 including bushing 39. Cover 511 has two forward tabs 515 and 517 which engage the inside lip of the front cover to hold cover 511 down and in place against the base 19. Likewise groove 519 and tongue 521 interlock to hold the cover 511 in place when the subassembly 13 is raised with the cover in place as may happen when the entire console is turned upside down during unpacking or it is otherwise being handled. Pinion gear 322 of damper 321 then interferes with the inside top surface of cover 511 to prevent subassembly 13 from swinging open all the way and releasing the keyed pivots 323. Latch pin 525 which is part of sliding cover 527, over the client card compartment, interacts with latch lip 523 to hold the side cover 511 in place when cover 511 is closed the sliding client card compartment cover 527 in slid into place. Cover 527 slides on grooves in the rear side walls of base 19 and is held in place by detent 529. FIG. 6 is a rear section view of the console of the invention through a side cover with the assembly 13 raised into operating position.

Figure 7:
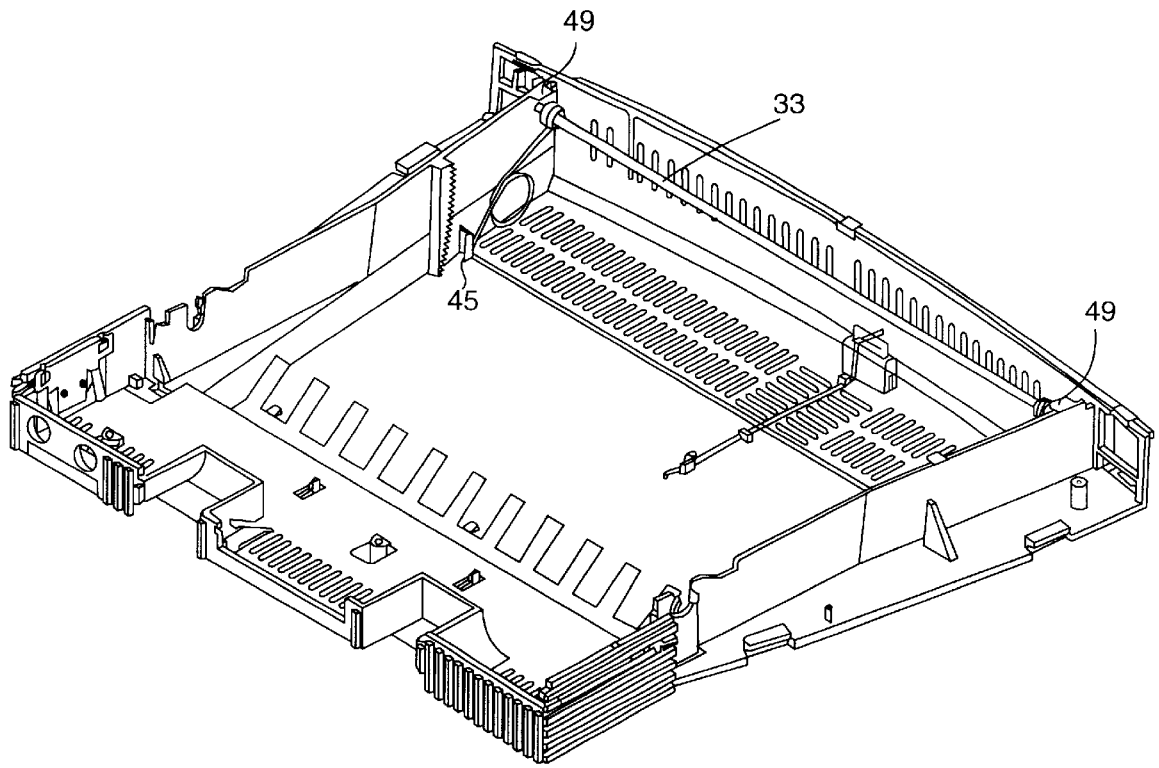
FIG. 7 is a perspective view of the interior of the base showing how the lift spring is contained and how the latch spring is mounted into the base.

FIG. 7 shows a perspective view of the base 19 with the spring 21 installed ready to receive the assembly 13. FIG. 7 better shows how spring 21 is held in place between supports 45 and stops 47 in readiness for the insertion and pivoting of the upper assembly into operating position. A top portion 49 of each stop 47 is made wider than the forward portion of stop 47 so as to contact an outer chamfered edge of the outer cylindrical surface of the bushings 39, 41 and act to center the rod and bushing assembly laterally in the base 19.

Having described the invention in terms of a preferred embodiment thereof, it will be recognized by those skilled in the art of computer equipment design that various additional changes in the structure and operation of the implementation described can be made without departing from the spirit and scope of the invention which is measured by the following claims.

We claim:

1. An electronic device having an assembly containing components that become accessible for use when the assembly is raised on a base by a lift spring, the improvement comprising:

keyed pivots connecting the assembly to the base, the assembly being rotatable on the keyed pivots for release of the assembly allowing the assembly to be lifted out of the base without the use of tools;

a client card compartment for easy access to cables connecting an electronic component mounted in the assembly to the base and allowing unplugging of the component without resort to tools;

the client compartment having a cover that slides into place along capturing tracks and is held in place by a detent;

side covers having connecting elements that interlock with the base; and the client compartment cover having pins on one edge, each of the pins, when the client cover slides into place, engaging an element of a side cover to lock the side cover to the base.

2. An electronic device having an assembly containing components that become accessible for use when the assembly is raised on a base by a lift spring, the improvement comprising:

keyed pivots connecting the assembly to the base, the assembly being rotatable on the keyed pivots for release of the assembly allowing the assembly to be lifted out of the base without the use of tools;

wherein the lift spring is a wire spring assembly further comprising:

a base portion substantially at the center of the wire spring;

a substantially right angle bend at each end of the base portion, each bend forming a leg, the legs each having the same shape;

each leg having a coil in the form of a loop;

each leg having an end with a hook engaging a rod;

the rod having a seat at each end for receiving the hook of one of the legs to form a lift spring assembly;

the base further comprising:

supports in the base floor for engaging the base portion of the lift spring and providing purchase from which the lift spring provides lifting force; and stops projecting from sidewalls of the base for containing the lift spring when the lift spring is in a fully extended position.

3. The electronic device of claim 2 wherein the seat at each end of the rod further comprise bushings slipped over the rod ends, the bushings having a groove in their outer cylindrical surface for receiving the hook at the ends of the spring legs.

4. An electronic device having an assembly containing components that become accessible for use when the assembly is raised on a base by a lift spring, the improvement comprising:

keyed pivots connecting the assembly to the base, the assembly being rotatable on the keyed pivots for release of the assembly allowing the assembly to be lifted out of the base without the use of tools; and a rotary viscous damping element mounted to the assembly, the rotary viscous damping element having a gear connected to a damping mechanism, the gear engaging a curved rack, the curved rack lying along an arc of a circumference of a circle having a center at a line connecting the keyed pivots, the rack having a length and position such that the gear engages the rack when the assembly is in a position between and including the closed position and the operating position and the gear disengages from the rack as the assembly is rotated past the operating position to be lifted out of the base.

5. The electronic device of claim 4 further comprising:

side covers having connecting elements that interlock with the base; and the side covers interfering with the gear, preventing rotation of the assembly, when an attempt is made to raise the assembly from the operating position without removing the side covers.

* * * * *